US010325968B2

United States Patent
An et al.

(12) United States Patent
(10) Patent No.: US 10,325,968 B2
(45) Date of Patent: Jun. 18, 2019

(54) REFLECTIVE DISPLAY DEVICE

(71) Applicant: LG Display Co., Ltd., Seoul (KR)

(72) Inventors: Hyun Jin An, Gyeonggi-do (KR); Jong Moo Kim, Seoul (KR); Jin Hyun Jung, Seoul (KR)

(73) Assignee: LG Display Co., Ltd., Seoul (KR)

(*) Notice: Subject to any disclaimer, the term of this patent is extended or adjusted under 35 U.S.C. 154(b) by 65 days.

(21) Appl. No.: 15/340,104

(22) Filed: Nov. 1, 2016

(65) Prior Publication Data

US 2017/0170243 A1 Jun. 15, 2017

(30) Foreign Application Priority Data

Dec. 9, 2015 (KR) ........................ 10-2015-0174718

(51) Int. Cl.

| | |
|---|---|
| ***H01L 27/32*** | (2006.01) |
| ***G02F 1/163*** | (2006.01) |
| ***H01L 51/52*** | (2006.01) |
| ***G02F 1/155*** | (2006.01) |
| ***G02F 1/157*** | (2006.01) |
| *G02F 1/1362* | (2006.01) |
| *H01L 27/12* | (2006.01) |

(52) U.S. Cl.

CPC .......... *H01L 27/3232* (2013.01); *G02F 1/155* (2013.01); *G02F 1/157* (2013.01); *G02F 1/163* (2013.01); *H01L 27/326* (2013.01); *H01L 27/3262* (2013.01); *H01L 51/5281* (2013.01); *G02F 1/13624* (2013.01); *G02F 2001/1555* (2013.01); *G02F 2001/1635* (2013.01); *G02F 2201/44* (2013.01); *G02F 2203/09* (2013.01); *G02F 2203/62* (2013.01); *H01L 27/1214* (2013.01); *H01L 27/3246* (2013.01); *H01L 51/5228* (2013.01)

(58) Field of Classification Search

CPC ............... H01L 27/3232; H01L 27/326; H01L 27/3262; H01L 51/5281; H01L 27/1214; H01L 27/3246; H01L 51/5228; G02F 1/155; G02F 1/157; G02F 1/163; G02F 1/13624; G02F 2001/1555; G02F 2001/1635; G02F 2201/44; G02F 2203/09; G02F 2203/62

USPC ........................................................ 359/269

See application file for complete search history.

(56) References Cited

U.S. PATENT DOCUMENTS

| | | | |
|---|---|---|---|
| 5,847,860 | A | 12/1998 | Hougham et al. |
| 2003/0052869 | A1 | 3/2003 | Fujii et al. |
| 2004/0233537 | A1 | 11/2004 | Agrawal et al. |
| 2015/0014650 | A1 | 1/2015 | Lim et al. |
| 2015/0144902 | A1 | 5/2015 | Do et al. |
| 2015/0212383 | A1 | 7/2015 | Oukassi |

FOREIGN PATENT DOCUMENTS

| | | | |
|---|---|---|---|
| WO | 2004/085567 | A2 | 10/2004 |
| WO | 2014/026962 | A1 | 2/2014 |

*Primary Examiner* — Wen Huang

(74) *Attorney, Agent, or Firm* — Morgan, Lewis & Bockius LLP

(57) ABSTRACT

A reflective display device is disclosed, which includes first and second substrates facing each other, each of which includes a display area and a reflective area; a display element provided in the display area; and a reflective control element provided in the reflective area, controlling reflectance of externally incident light. The reflective display device may improve a contrast ratio by controlling reflectance of a reflective area when an image is displayed.

12 Claims, 10 Drawing Sheets

Display Area
Reflective Area
210 260 280
405 430 450
230 240 232 231
220 CH5 240 250 220
200 470 400
181 182 180 191 192 190
CH1 CH2 CH3 CH4 CH6
460 440 165 105
II II'
161 162 163 153 152 151 361 362 363 353 352 351
170 160 120 130 110 150 140 360 120 130 110 350 140
100 300

Display Area
Reflective Area
II
II'

Reflective Area
Display Area
400
405
430
450
470
460
440
170
165
105
II'
II
280
260
210
200
230
231
232
240
220
250
191
192
190
181
182
180
CH1
CH2
CH3
CH4
CH5
CH6
140
351
352
353
350
110
130
120
300
361
362
363
360
151
152
153
150
100
161
162
163
160

REFLECTIVE DISPLAY DEVICE

CROSS REFERENCE TO RELATED APPLICATIONS

This application claims the benefit of the Korean Patent Application No. 10-2015-0174718 filed on Dec. 9, 2015, which is hereby incorporated by reference for all purposes as if fully set forth herein.

BACKGROUND OF THE INVENTION

Field of the Invention

The present invention relates to a display device, and more particularly, to a reflective display device.

Discussion of the Related Art

Recently, with the advancement of the information age, display fields for processing and displaying a large amount of information have been rapidly developed. In response to this trend, various display devices have been introduced and spotlighted. The display devices include liquid crystal display (LCD) devices, plasma display panel (PDP) devices, field emission display (FED) devices, electroluminescence display (ELD) devices and organic light emitting display (OLED) devices.

Recently, the display devices have had properties of a thin profile, a light weight, and low power consumption, whereby application fields of the display devices have been continuously increased. Particularly, the display device has been used as one of the user interfaces in most of electronic devices and mobile devices.

Also, recently, a reflective display device including a reflective area and a display area has been actively studied. A reflective display device may be used as a mirror by reflecting light when an image is not displayed and serves as a general display device when an image is displayed.

According to a related art, however, a related art reflective display device does not control reflectance and a contrast ratio is low because high reflectance is always maintained even when an image is displayed. Thus, the reflective display device cannot be properly operated as a display device.

FIG. 1 is a plane view illustrating one pixel structure of a related art reflective display device that includes a top emission type organic light emitting diode, and FIG. 2 is a cross-sectional view taken along line I-I' shown in FIG. 1.

Referring to FIGS. 1 and 2, the related art reflective display device includes a display area and a reflective area.

A thin film transistor T is formed on the display area, wherein the thin film transistor T includes a first substrate 10, an active layer 11, a gate insulator 12, a gate electrode 13, an interlayer dielectric 14, a source electrode 15, and a drain electrode 16, and a passivation layer 20 and a planarization layer 30 are formed on the thin film transistor T in due order.

An anode electrode 40 and an auxiliary electrode 50 are formed on the planarization layer 30. The auxiliary electrode serves to reduce resistance of a cathode electrode 80 which will be described later. A bank 60 is formed on the anode electrode 40 and the auxiliary electrode 50 to define a pixel area, an organic light emitting layer 70 is formed in the pixel area defined by the bank 60, and the cathode electrode 80 is formed on the organic light emitting layer 70.

A black matrix 91 and a color filter 92 are formed on a second substrate 90.

A reflective metal 93 is arranged on a reflective area of the second substrate 90. When an image is not displayed on the display area, the reflective metal 93 may serve as a mirror by reflecting light.

However, the reflective metal is maintained at high reflectance even when an image is displayed on the display area, whereby a contrast ratio is lowered and thus the reflective display device cannot be properly operated as a display device.

The related art described above is based on technical information owned by the inventor to derive the present invention or gained through the process of deriving the present invention, and is not necessarily known to the public prior to filing of the application of the present invention.

SUMMARY

Accordingly, the present invention is directed to a reflective display device that substantially obviates one or more problems due to limitations and disadvantages of the related art.

An object of the present invention is to provide a reflective display device that may improve a contrast ratio by controlling reflectance of a reflective area when an image is displayed.

Another object of the present invention is to provide a reflective display device that is capable of simultaneously realizing a reflective mode and a display mode by controlling reflectance of a reflective area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a reflective display device comprises first and second substrates facing each other, each of which includes a display area and a reflective area; a display element provided in the display area; and a reflective control element provided in the reflective area, controlling reflectance of externally incident light.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
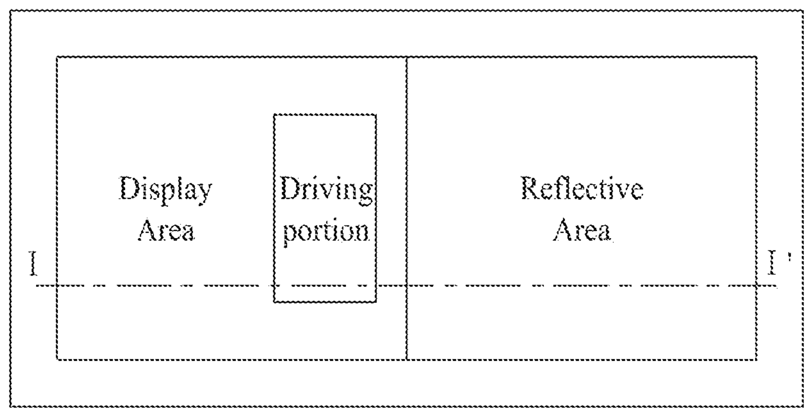
FIG. 1 is a plane view illustrating one pixel of a related art reflective display device.
Figure 2:
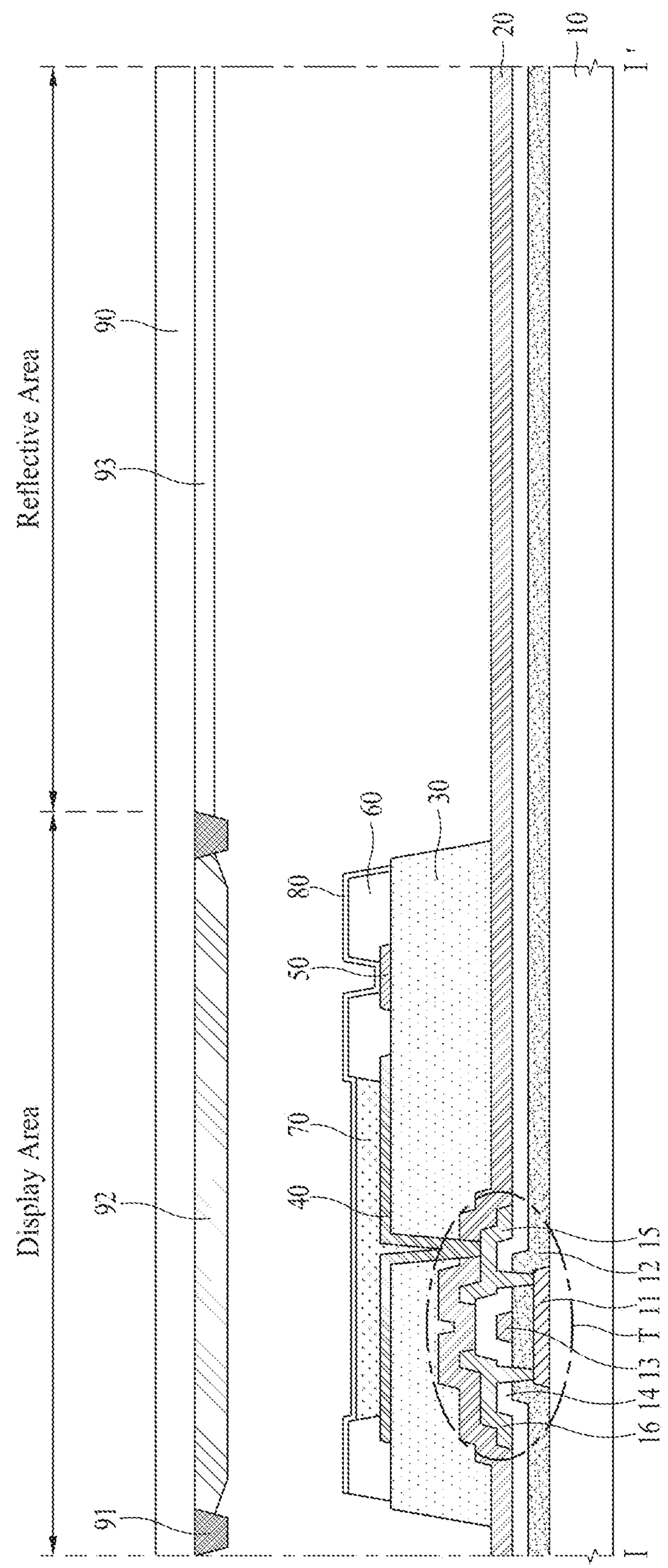
FIG. 2 is a cross-sectional view taken along line I-I' shown in FIG. 1.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

Figure 3:
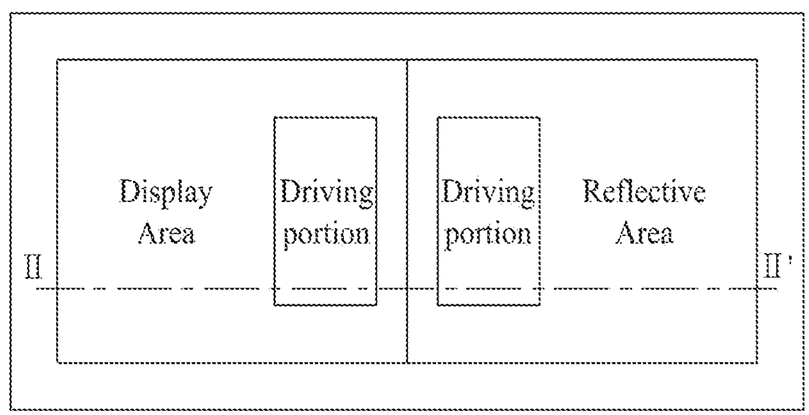
FIG. 3 is a plane view illustrating one pixel of a reflective display device according to an embodiment of the present invention.
Figure 4:
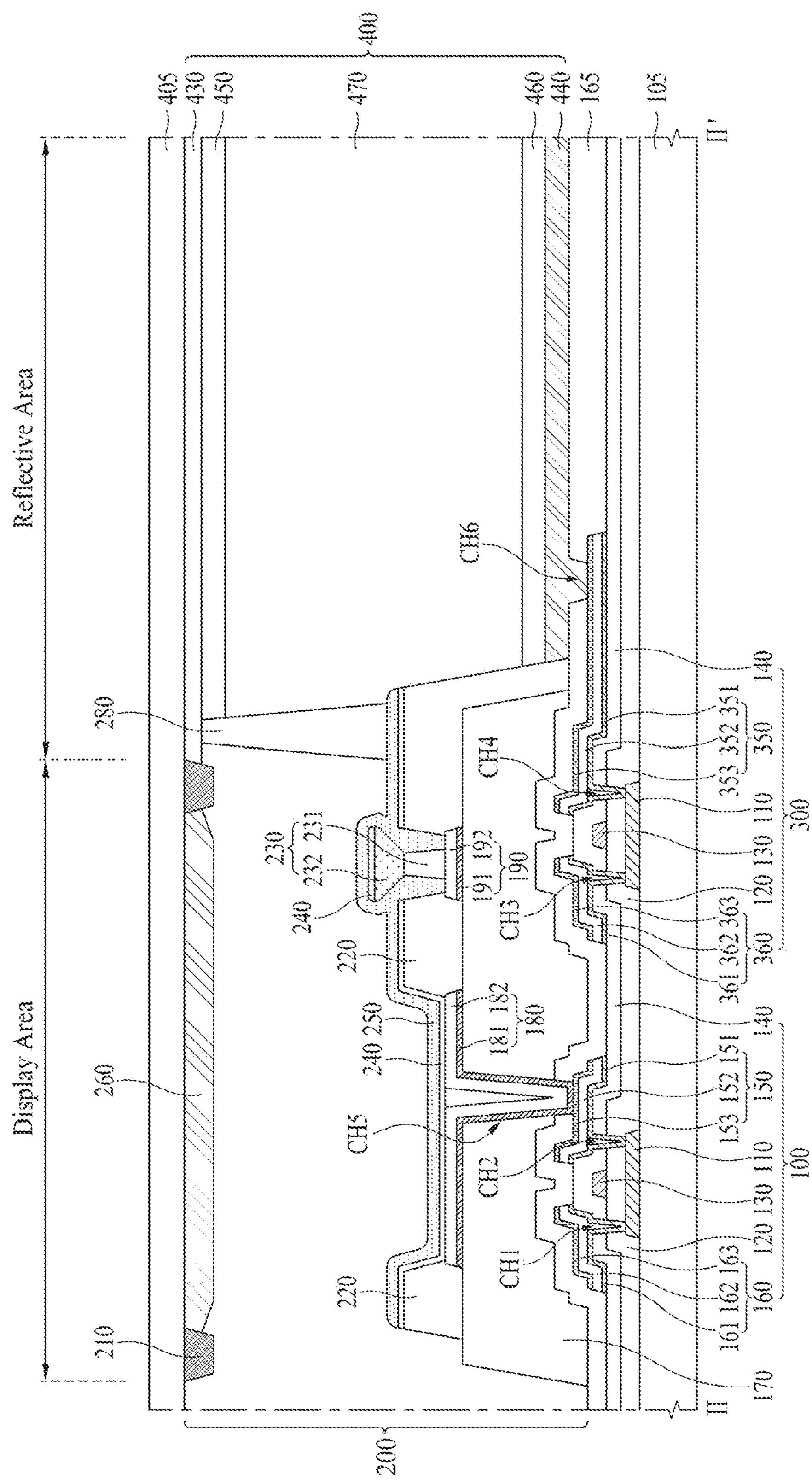
FIG. 4 is a cross-sectional view taken along line II-II' shown in FIG. 3.

FIG. 3 is a plane view illustrating one pixel of a reflective display device according to an embodiment of the present invention, and FIG. 4 is a cross-sectional view taken along line II-II' shown in FIG. 3.

Referring to FIGS. 3 and 4, the reflective display device according to an embodiment of the present invention includes first and the second substrates 105 and 405 facing each other, each of which includes a display area and a reflective area. The reflective display device further comprises a barrier 280 provided between the first substrate 105 and the second substrate 405, portioning the reflective area and the display area from each other. The display area is provided with a display element 200, and the reflective area includes a reflective control element 400. The reflective area will first be described, which will be followed by description of the display area.

The reflective control element 400 provided in the reflective area is arranged between the first substrate 105 and the second substrate 405, and includes a transparent electrode 430, a reflective electrode 440, a counter layer 450, an electrochromic layer 460, and an electrolytic layer 470.

The transparent electrode 430 is provided on one surface of the second substrate 405 to face the first substrate 105, and the reflective electrode 440 is provided on one surface of the first substrate 105 to face the second substrate 405. Since the reflective electrode 440 serves to reflect light during a reflective mode, the reflective electrode 440 may be an opaque electrode.

The transparent electrode 430 may be, but not limited to, Ag oxide (e.g., AgO or $Ag_2O$ or $Ag_2O_3$), aluminum oxide (e.g., $Al_2O_3$), tungsten oxide (e.g., $WO_2$ or $WO_3$ or $W_2O_3$), magnesium oxide (e.g., MgO), molybdenum oxide (e.g., $MoO_3$), zinc oxide (e.g., ZnO), tin oxide (e.g., $SnO_2$), indium oxide (e.g., $In_2O_3$), chrome oxide (e.g., $CrO_3$ or $Cr_2O_3$), antimony oxide (e.g., $Sb_2O_3$ or $Sb_2O_5$), titanium oxide (e.g., $TiO_2$), nickel oxide (e.g., NiO), copper oxide (e.g., CuO or $Cu_2O$), vanadium oxide (e.g. $V_2O_3$ or $V_2O_5$), cobalt oxide (e.g., CoO), iron oxide (e.g., $Fe_2O_3$ or $Fe_3O_4$), niobium oxide (e.g., $Nb_2O_5$), indium tin oxide (ITO), indium zinc oxide (IZO), aluminum doped zinc oxide (ZAO), aluminum doped tin oxide (e.g., TAO) or antimony tin oxide (ATO).

The counter layer 450 is provided on one surface of the transparent electrode 430 to face the first substrate 105, and the electrochromic layer 460 is provided on one surface of the reflective electrode 440 to face the second substrate 405.

The counter layer 450 and the electrochromic layer 460 have a relation with each other as follows. If the counter layer 450 is subjected to an oxidation reaction, the electrochromic layer 460 is subjected to a reduction reaction, and if the counter layer 450 is subjected to an reduction reaction, the electrochromic layer 460 is subjected to a oxidation reaction.

That is, if a voltage is applied to each of the transparent electrode 430 and the reflective electrode 440, the counter layer 450 and the electrochromic layer 460 are subjected to an electrochemical oxidation-reduction reaction, whereby colors of the counter layer 450 and the electrochromic layer 460 are changed.

For example, if a positive voltage is applied to the transparent electrode 430 and a negative voltage is applied to the reflective electrode 440, a reduction reaction occurs in the electrochromic layer 460, and an oxidation reaction occurs in the counter layer 450. Since the electrochromic layer 460 is changed to a predetermined color such as black by the reduction reaction, the electrochromic layer 460 may absorb incident light. That is, a display mode for displaying an image in the display element 200 only may be operated. In this case, since the reflective mode for reflecting light is not operated, a contrast ratio may be improved when the display mode is operated.

Also, if a negative voltage is applied to the transparent electrode 430 and a positive voltage is applied to the reflective electrode 440, a reduction reaction occurs in the counter layer 450, and an oxidation reaction occurs in the electrochromic layer 460. Since the electrochromic layer 460 is changed to be transparent by the oxidation reaction, the electrochromic layer 460 may transmit incident light, thus the reflective electrode 440 realizes the reflective mode for reflecting light.

The counter layer 450 corresponds to an assistance layer that allows the electrochromic layer 460 to be smoothly subjected to an oxidation-reduction reaction. The counter layer 450 may include a counter material that has a predetermined color by absorbing the predetermined color if an oxidation reaction occurs and is changed to be transparent by a reduction reaction. The counter material may be TMPD (N,N,N',N'-tetramethyl-1,4-phenylenediamine), TMB (3,3',5,5'-Tetramethylbenzidine), NTMB (N,N,N',N'-Tetramethylbenzidine) or DAB (3,3'-Diaminobenzidine). The counter layer 450 may be omitted.

The electrochromic layer 460 may include a core material such as Transparent Conductive Oxides (TCO) and an electrochromic material mixed with the core material. The core material may be $TiO_2$, $In_2O_3$, $SnO_2$, $RuO_2$, or a material obtained by surface-treating ITO with $TiO_2$. The electrochromic material has a predetermined color by absorbing the predetermined color if a reduction reaction occurs, and may be a material which is changed to be transparent if an oxidation reaction occurs. For example, the electrochromic material may be 1,1'-dibenzyl-4,4'-bipyridinium bistetrafluorborate. It is preferable that the core material is mixed with electrochromic materials having various colors through a reduction reaction to enhance a light absorption function of the electrochromic layer 460.

The electrolytic layer 470 may include an electrolyte, a polymer and a UV initiator. The electrolyte may be lithium perchlorate, t-butylammoinum perchlorate, t-butylammoinum-t-fluoroborate, or tetrabutylammonium trifluoromethanesulfonate. The polymer may be acrylate based polymer, polyester based polymer, or epoxy based polymer. The UV initiator may be benzoin ether based UV initiator or amine based UV initiator. The electrolytic layer 470 may be formed by depositing a liquid crystal material having viscosity and then UV hardening the liquid crystal material. The electrolytic layer 470 provides positive ions and negative ions to allow the electrochromic layer 460 and the counter layer 450 to be subjected to an oxidation-reduction reaction.

The reflective control element 400, which is provided in the reflective area and controls reflectance of externally incident light, may be operated to, but not limited to, reflect or absorb the externally incident light. That is, the reflective control element 400 may control reflectance by reflecting or absorbing all or some of the incident light.

Hereinafter, the display area, which includes the display element 200 shown in FIG. 4, will be described.

A first driving element 100, a second driving element 300, a passivation layer 165, a planarization layer 170, an anode electrode 180, an auxiliary electrode 190, a bank 220, a barrier 230, an organic light emitting layer 240, and a cathode electrode 250 are formed on the first substrate 105. A black matrix 210 and a color filter 260 are formed on the second substrate 405.

The first driving element 100 is a thin film transistor for emitting light by driving the display element 200, and includes an active layer 110, a gate insulating film 120, a gate electrode 130, an interlayer dielectric 140, a source electrode 150, and a drain electrode 160.

The second driving element 300 is a thin film transistor for controlling reflectance by driving the reflective control element 400 of the reflective area. Although the second driving element 300 is shown in the display area, the second driving element 300 is not limited to the display area. For example, the second driving element 300 may be arranged in the display area or the reflective area. Also, the second driving element 300 is not required to be provided per one pixel, and the reflective control elements 400 of all pixels may be driven using one second driving element 300. Also, the second driving element 300 is not required essentially, and the reflective control element 400 of the reflective area may be driven using the first driving element 100.

The second driving element 300 includes an active layer 110, a gate insulating film 120, a gate electrode 130, an interlayer dielectric 140, a source electrode 350, and a drain electrode 360. The source electrode 350 is connected to the reflective electrode 440 of the reflective area and applies a voltage. However, without limitation to this case, the source electrode 350 may be extended to the reflective area, and may serve as the reflective electrode 440. Hereinafter, the repeated description of the second driving element 300 with respect to the first driving element 100 will be omitted to avoid repetition.

The active layer 110 is formed to be overlapped the gate electrode 130 on the substrate 100. The active layer 110 may be made of a silicon based semiconductor material or an oxide based semiconductor material.

The gate insulating film 120 is formed on the active layer 110. The gate insulating film 120 serves to insulate the active layer 110 from the gate electrode 130. The gate insulating film 120 may be made of, but not limited to, an inorganic insulating material, for example, a silicon oxide film ($SiO_X$), a silicon nitride film ($SiN_X$), or a multi-layer of $SiO_X$ and $SiN_X$.

The gate electrode 130 is formed on the gate insulating film 120. The gate electrode 130 is formed to overlap the active layer 110 by interposing the gate insulating film 120 therebetween.

The interlayer dielectric 140 is formed on the gate electrode 130. The interlayer dielectric 140 may be formed of, but not limited to, the same inorganic insulating material as that of the gate insulating film 120, for example, a silicon oxide film ($SiO_X$), a silicon nitride film ($SiN_X$), or a multi-layer of $SiO_X$ and $SiN_X$.

The source electrode 150 or 350 and the drain electrode 160 or 360 are formed on the interlayer dielectric 140 to face each other. The aforementioned gate insulating film 120 and the aforementioned interlayer dielectric 140 are provided with first and third contact holes CH1 and CH3 and second and fourth contact holes CH2 and CH4, wherein the first and third contact holes CH1 and CH3 expose one end area of the active layer 110, and the second and fourth contact holes CH2 and CH4 expose the other end area of the active layer 110. The source electrode 150 and 350 is connected with the other end area of the active layer 110 through the second and fourth contact holes CH2 and CH4, and the drain electrode 160 and 360 is connected with the one end area of the active layer 110 through the first and third contact holes CH1 and CH3. Also, the source electrode 150 or 350 may include a lower source electrode 151 or 351, a central source electrode 152 or 352, and an upper source electrode 153 or 353. Also, the source electrode 350 of the second driving element 300 is connected with the reflective electrode 440 of the reflective area through a sixth contact hole CH6.

The lower source electrode 151 or 351 is formed between the interlayer dielectric 140 and the central source electrode 152 or 352 and may serve to enhance adhesion between the interlayer dielectric 140 and the central source electrode 152 or 352. Also, the lower source electrode 151 or 351 protects the lower surface of the central source electrode 152 or 352 to prevent the lower surface of the central source electrode 152 or 352 from being corroded.

The central source electrode 152 or 352 is formed between the lower source electrode 151 or 351 and the upper source electrode 153 or 353. The central source electrode 152 or 352 may be made of, but not necessarily limited to, copper (Cu) which is a metal with low resistance. The upper source electrode 153 or 353 is formed on the upper surface of the central source electrode 152 or 352 and therefore may prevent the upper surface of the central source electrode 152 or 352 from being corroded.

Similarly to the aforementioned source electrode 150 or 350, the drain electrode 160 or 360 may include a lower drain electrode 161 or 361, a central drain electrode 162 or 362, and an upper drain electrode 163 or 363. To avoid repeated description, the same description will be omitted.

The aforementioned first and second driving elements 100 and 300 may be modified to various structures known to those skilled in the art without limitation to the above structure as shown. For example, although the first and second driving elements 100 and 300 are formed in a top gate structure in the drawing in which the gate electrode 130 is formed above the active layer 110, the first and second driving elements 100 and 300 may be formed in a bottom gate structure in which the gate electrode 130 is formed below the active layer 110.

The passivation layer 165 is formed on the first and second driving elements 100 and 300, more specifically on the source electrodes 150 and 350 and the drain electrodes 160 and 360. The passivation layer 165 serves to protect the first and second driving elements 100 and 300, and may be made of, but not limited to, an inorganic insulating material, for example, $SiO_X$ or $SiN_X$.

The planarization layer 170 is formed on the passivation layer 165. The planarization layer 170 serves to planarize the upper portion of the substrate 105 provided with the first and second driving elements 100 and 300. The planarization layer 170 may be made of, but not limited to, an organic insulating material such as acrylic resin, epoxy resin, phenolic resin, polyamide resin, and polyimide resin.

The anode electrode 180 and the auxiliary electrode 190 are formed on the planarization layer 170. That is, the anode electrode 180 and the auxiliary electrode 190 are formed on the same layer as each other. The aforementioned passivation layer 165 and the aforementioned planarization layer 170 are provided with a fifth contact hole CH5 that exposes the source electrode 150, and the source electrode 150 and the anode electrode 180 are connected with each other through the fifth contact hole CH5. The anode electrode 180 may include a lower anode electrode 181 and an upper anode electrode 182, and the auxiliary electrode 190 may include a lower auxiliary electrode 191 and an upper auxiliary electrode 192.

The bank 220 is formed on the anode electrode 180 and the auxiliary electrode 190. The bank 220 is formed on one side and the other side of the anode electrode 180 while exposing an upper surface of the anode electrode 180. The bank 220 may obtain an area where an image is displayed, by being formed to expose the upper surface of the anode electrode 180.

The bank 220 is formed on one side and the other side of the auxiliary electrode 190 while exposing an upper surface of the auxiliary electrode 190. The bank 220 may obtain an electric connection space between the auxiliary electrode 190 and the cathode electrode 250 by being formed to expose the upper surface of auxiliary electrode 190.

The barrier 230 is formed on the auxiliary electrode 190. The barrier 230 is spaced apart from the bank 220 at a predetermined distance, and the auxiliary electrode 190 and the cathode electrode 250 are electrically connected with each other through the spaced area between the barrier 230 and the bank 220.

If the barrier 230 is not formed, in order that the upper surface of the auxiliary electrode 190 is not covered by the organic light emitting layer 240, a mask pattern covering the upper surface of the auxiliary electrode 190 is required when the organic light emitting layer 240 is deposited. However, if the barrier 230 is formed, the upper surface of the barrier 230 serves as eaves when the organic light emitting layer 240 is deposited, thus the organic light emitting layer is not deposited below the eaves, and therefore a mask pattern covering the upper surface of the auxiliary electrode 190 is not required.

The barrier 230 is formed to have an upper surface wider than its lower surface. The barrier 230 may include a first barrier 231 and a second barrier 232, wherein the first barrier 231 is formed below the second barrier 232.

The organic light emitting layer 240 is formed on the anode electrode 180. The organic light emitting layer 240 may include a hole injecting layer, a hole transporting layer, an emitting layer, an electron transporting layer, and an electron injecting layer. The organic light emitting layer 240 may be modified to various types known to those skilled in the art.

The cathode electrode 250 is formed on the organic light emitting layer 240. Since the cathode electrode 250 is formed on a surface where light is emitted, the cathode electrode 250 is made of a transparent conductive material. Since the cathode electrode 250 is made of a transparent conductive material, it has high resistance. Therefore, the cathode electrode 250 is connected with the auxiliary electrode 190 to reduce resistance of the cathode electrode 250. That is, the cathode electrode 250 is connected with the auxiliary electrode 190 through the spaced area between the barrier 230 and the bank 220. Since the cathode electrode 250 may be formed through a deposition process, such as sputtering, which does not have good linearity of a deposition material, the cathode electrode 250 may be deposited on the spaced area between the barrier 230 and the bank 220 during the deposition process of the cathode electrode 250.

Although not shown, an encapsulation layer may additionally be formed on the cathode electrode 250 to prevent water permeation from occurring.

As described above, the reflective display device according to an embodiment of the present invention may include a display area and a reflective area, and therefore may be operated in a display mode and a reflective mode. Also, the reflective mode and the display mode may be operated at the same time.

For example, when the display element 200 is driven in the display area to display an image, the reflective control element 400 in the reflective area serves to absorb light without reflecting the light, whereby a contrast ratio may be improved.

For example, when the display element 200 is not driven in the display area so as not to display an image, the reflective control element 400 in the reflective area serves to reflect light without absorbing the light, whereby the reflective control element 400 may be operated in a reflective mode that reflects an object.

For example, when the display element 200 is driven in the display area to display an image, the reflective control element 400 in the reflective area serves to reflect light or absorb light at the same time, two modes of the reflective mode and the display mode may be performed.

Figure 5A:
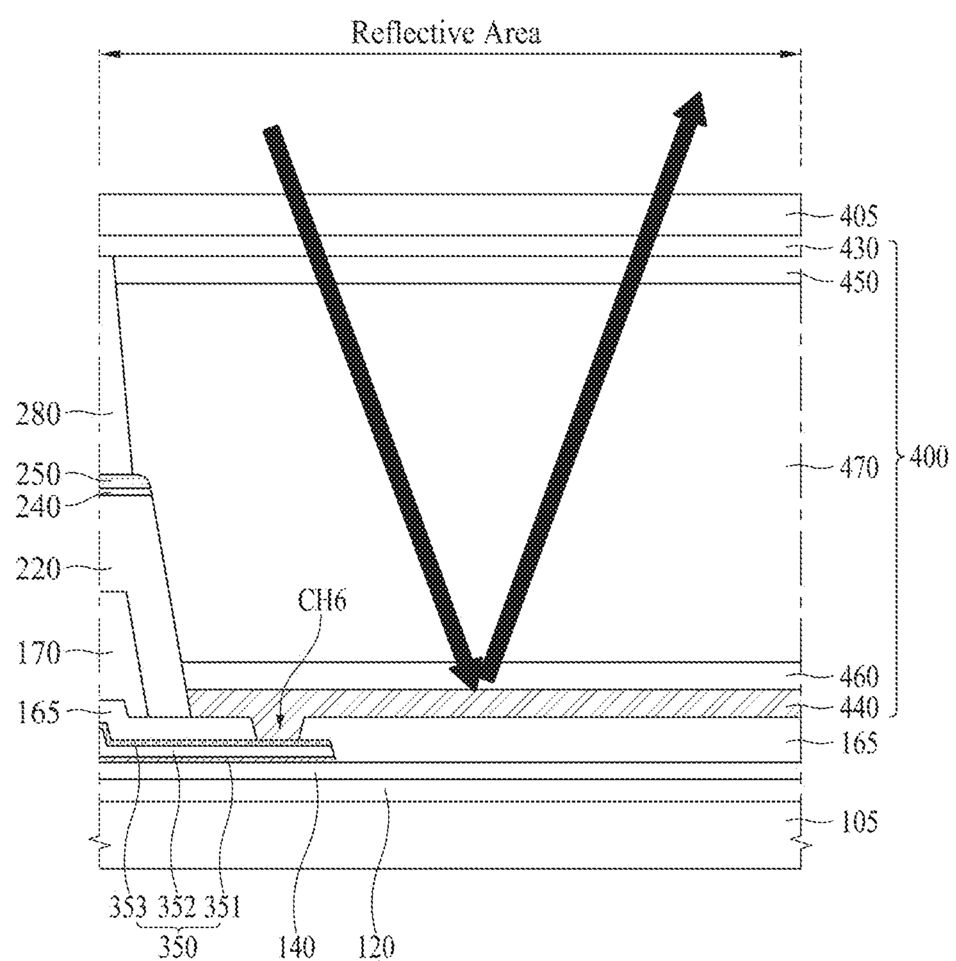
FIGS. 5A and 5B are views illustrating advantages of an embodiment of the present invention.
Figure 5B:
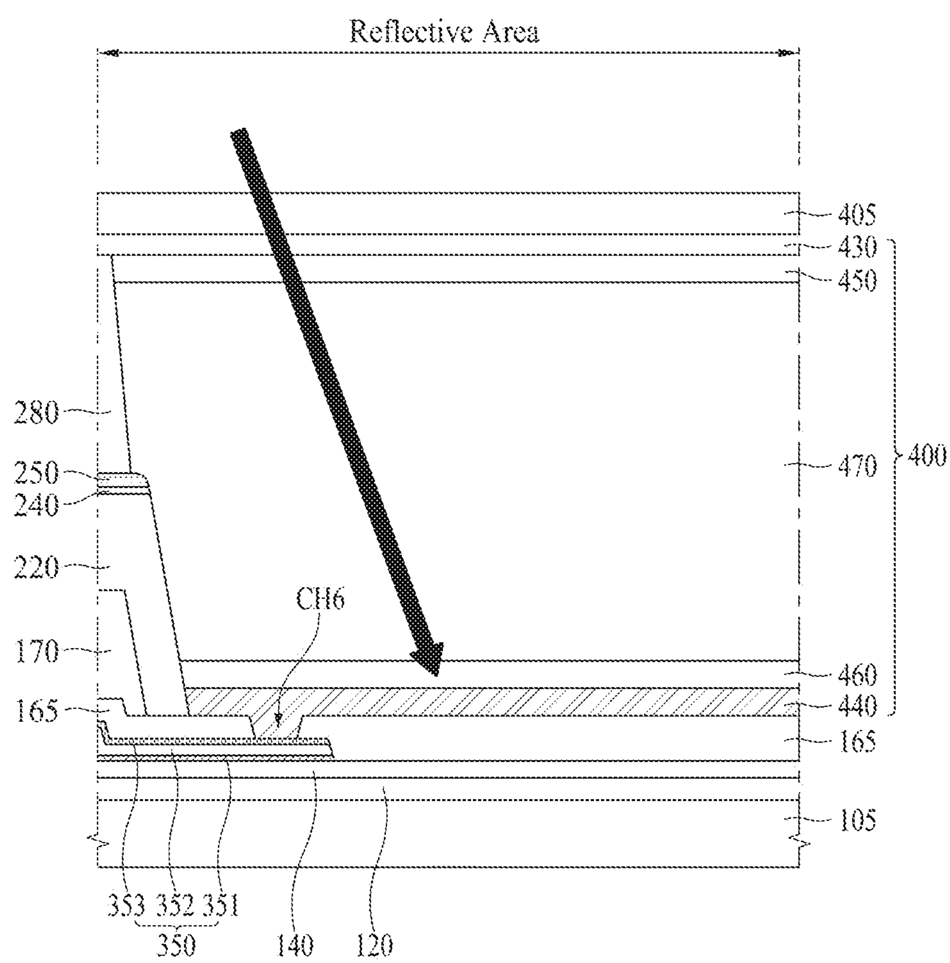

FIGS. 5A and 5B are views illustrating advantages of a reflective area of the reflective display device according to the present invention.

Referring to FIG. 5A, the reflective control element 400 in the reflective area may serve to reflect light. That is, if a negative voltage is applied to a transparent electrode 430 and a positive voltage is applied to a reflective electrode 440, a reduction reaction occurs in a counter layer 450, and an oxidation reaction occurs in an electrochromic layer 460. Since the electrochromic layer 460 is changed to be transparent by the oxidation reaction, the electrochromic layer 460 may realize the reflective mode, in which light is reflected in the reflective electrode 440, by transmitting incident light as it is.

Referring to FIG. 5B, the reflective control element 400 in the reflective area may serve to absorb light. That is, if a positive voltage is applied to the transparent electrode 430 and a negative voltage is applied to the reflective electrode 440, a reduction reaction occurs in the electrochromic layer 460, and an oxidation reaction occurs in the counter layer 450. Since the electrochromic layer 460 is changed to a predetermined color such as black by the reduction reaction, the electrochromic layer 460 may absorb incident light. In this case, only a display mode for displaying an image may be operated.

Figure 6A:
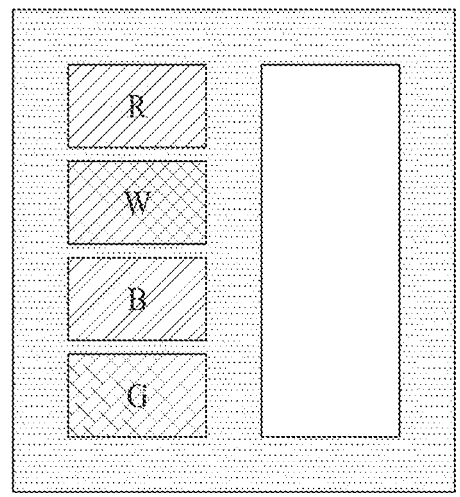
FIG. 6A is a view illustrating that a display mode and a reflective mode are simultaneously realized.
Figure 6B:
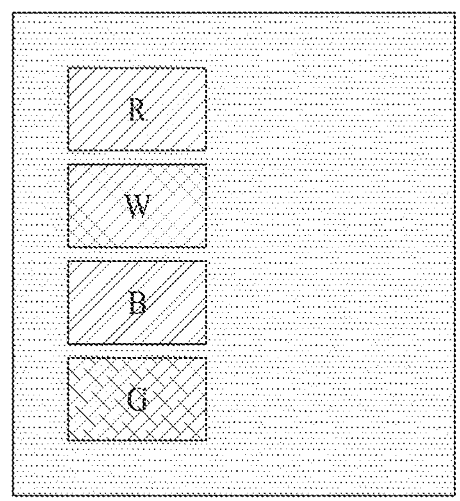
FIG. 6B is a view illustrating that a display mode is only realized.
Figure 6C:
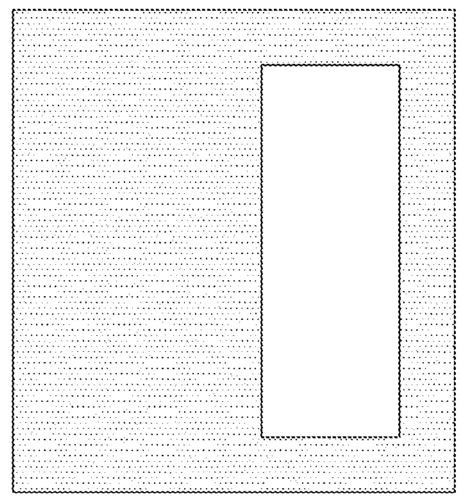
FIG. 6C is a view illustrating that a reflective mode is only realized.

FIGS. 6A to 6C briefly illustrate one pixel when each mode of a reflective display device according to the present invention is realized.

FIG. 6A is a view illustrating that a display mode and a reflective mode are simultaneously realized in the reflective display device according to an embodiment of the present invention. The display element 200 is driven in the display area to display an image, and the reflective control element 400 is driven in the reflective area, whereby the display mode and the reflective mode are operated. In this way, two modes may be operated at the same time, and each of the driving elements 100 and 300 may control the operation of each of the elements 200 and 400 by controlling voltage intensity.

FIG. 6B is a view illustrating a display mode corresponding to FIG. 5B. That is, referring to FIGS. 5B and 6B, the reflective control element 400 in the reflective area may serve to absorb light. If a positive voltage is applied to the transparent electrode 430 and a negative voltage is applied to the reflective electrode 440, a reduction reaction occurs in the electrochromic layer 460, and an oxidation reaction occurs in the counter layer 450. Since the electrochromic layer 460 is changed to a predetermined color such as black by the reduction reaction, the electrochromic layer 460 may absorb incident light. In this case, the display mode for displaying an image in the display element 200 only may be operated.

FIG. 6C is a view illustrating a reflective mode corresponding to FIG. 5A. That is, referring to FIGS. 5A and 6C, the reflective control element 400 in the reflective area may serve to reflect light. That is, if a negative voltage is applied to the transparent electrode 430 and a positive voltage is applied to the reflective electrode 440, a reduction reaction occurs in the counter layer 450, and an oxidation reaction occurs in the electrochromic layer 460. Since the electrochromic layer 460 is changed to be transparent by the oxidation reaction, the electrochromic layer 460 may realize the reflective mode, in which light is reflected in the reflective electrode 440, by transmitting incident light as it is.

Figure 7:
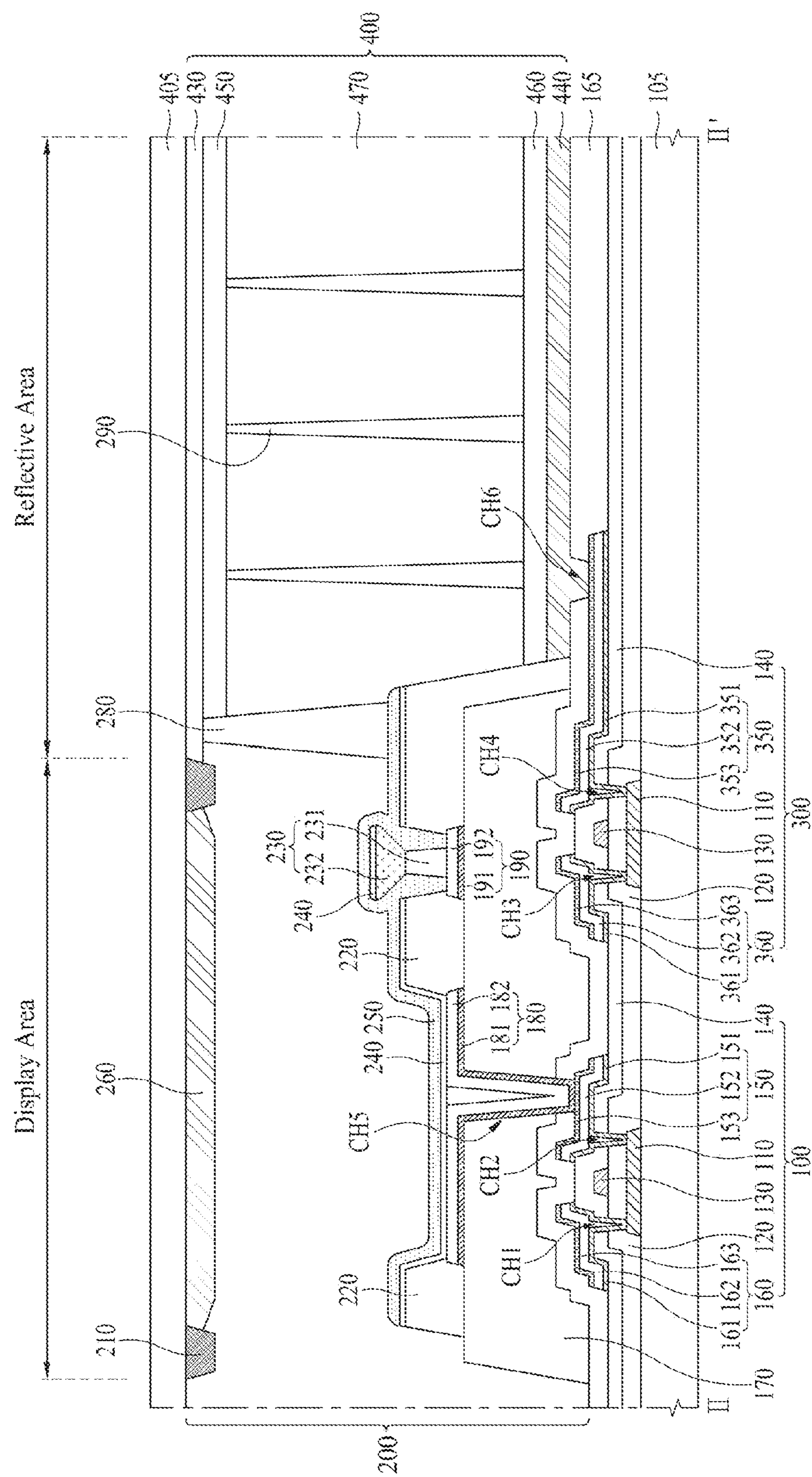
FIG. 7 is a view illustrating a reflective display device according to another embodiment of the present invention.

FIG. 7 is a view illustrating a reflective display device according to the second embodiment of the present invention.

FIG. 7 illustrates that some elements are added to the first embodiment of the present invention shown in FIG. 4, and repeated description of FIG. 4 will be omitted.

Referring to FIG. 7, the reflective display device according to the second embodiment of the present invention may further include a reflective barrier 290 on the reflective area.

The reflective barrier 290 is formed in the electrolytic layer 470 on reflective area and maintains a predetermined gap between the counter layer 450 and the electrochromic layer 460. Three reflective barriers 290 are shown but not limited to the drawing. For example, a plurality of reflective barriers 290 may be formed between the counter layer 450 and the electrochromic layer 460.

A width of the reflective barrier 290 becomes narrow toward the counter layer 450 from the electrochromic layer 460 as shown but is not limited to the shown example. For example, the width of the reflective barrier 290 may be uniform, or may become narrow toward the electrochromic layer 460.

Although a plane view of the reflective barrier 290 is not shown, the reflective barrier 290 may have various shapes on a plane view. For example, the reflective barrier 290 may have, but not limited to, a stripe pattern, a dot pattern or a honeycomb pattern.

The reflective barrier 290 may be formed of a transparent material. In this case, the reflective barrier 290 may be formed of, but not limited to, any one of a photo resist, a photo-hardening polymer, and polydimethysiloxane.

As described above, the reflective display device according to the second embodiment of the present invention barrier may be driven in the reflective mode and the display mode, and may further include the reflective barrier 290 in the electrolytic layer 470 on the reflective area to maintain a predetermined gap.

Figure 8:
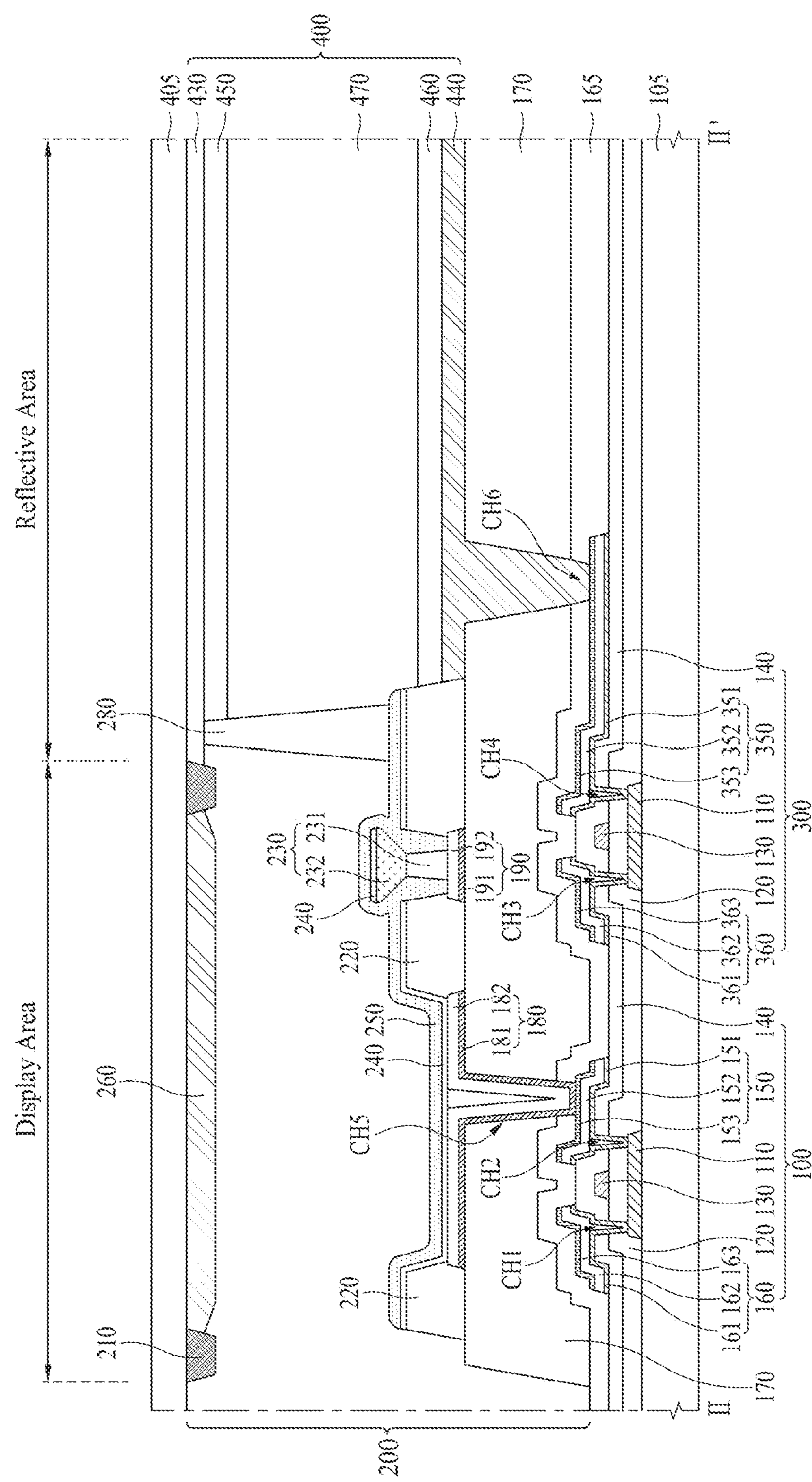
FIG. 8 is a view illustrating a reflective display device according to other embodiment of the present invention.

FIG. 8 is a view illustrating a reflective display device according to the third embodiment of the present invention.

FIG. 8 illustrates that some elements are added to the first embodiment of the present invention shown in FIG. 4, and repeated description of FIG. 4 will be omitted.

Referring to FIG. 8, in the reflective display device according to the third embodiment of the present invention, the reflective electrode 440 is provided on the planarization layer 170. That is, unlike the first embodiment shown in FIG. 4, the planarization layer 170 on the display area is extended to the reflective area, thus the planarization layer 170 is provided between the passivation layer 165 and the reflective electrode 440. Afterwards, a sixth contact hole CH6 for connecting the reflective electrode 440 with the source electrode 350 of the second driving element 300 is formed in the passivation layer 165 and the planarization layer 170.

The planarization layer 170 may be made of, but not limited to, an organic insulating material such as acryl resin, epoxy resin, phenolic resin, polyamide resin, and polyimide resin.

In the aforementioned reflective display device according to the third embodiment of the present invention, the planarization layer 170 is provided on the entire surface including the display area and the reflective area, whereby the number of masks may be reduced and therefore process steps may be simplified.

As described above, according to one embodiment of the present invention, the following advantages can be obtained.

First of all, when an image is displayed on the display area, light is absorbed in the reflective area, whereby a contrast ratio may be improved.

Second, when an image is not displayed on the display area, light is reflected in the reflective area, whereby the reflective mode may be driven.

Third, when reflectance is controlled to display an image on the display area, a contrast ratio may be improved.

Finally, the reflective display device can be obtained, which may display an image on the display area and at the same time reflect light in the reflective area.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A reflective display device, comprising:

first and second substrates facing each other, each of the first and second substrates including a display area and a reflective area;

a display element in the display area, the display element including:

an anode electrode at the first substrate;

an organic light emitting layer on the anode electrode; and a cathode electrode on the organic light emitting layer;

a first driving element configured to drive the display element;

a reflective control element in the reflective area, the reflective control element being configured to control reflectance of externally incident light, the reflective control element including:

a reflective electrode on one surface of the first substrate to face the second substrate; and a transparent electrode on one surface of the second substrate to face the first substrate; and at least one second driving element configured to drive the reflective control element, wherein a gap between the second substrate and the cathode in the display area is smaller than a gap between the transparent electrode and the reflective electrode in the reflective area, both gaps including a same electrolytic material.

2. The reflective display device of claim 1, wherein:

the reflective display device is configured to be driven in a display mode in which the display element is driven and a reflective mode in which the reflective control element is driven; and the reflective control element is configured to:

reflect externally incident light when the reflective mode is driven; and absorb externally incident light when the display mode is driven.

3. The reflective display device of claim 2, wherein:

the reflective control element is configured to partially reflect externally incident light and partially absorb the externally incident light; and the reflective mode and the display mode are driven at the same time.

4. The reflective display device of claim 1, further comprising a barrier between the first substrate and the second substrate, the barrier being configured to portion the reflective area and the display area from each other.

5. The reflective display device of claim 1, wherein the reflective control element further includes:

an electrochromic layer on the reflective electrode; and the electrolytic layer between the electrochromic layer and the transparent electrode.

6. The reflective display device of claim 5, wherein the reflective control element further includes a counter layer on the transparent electrode.

7. The reflective display device of claim 6, wherein:

the counter layer is subjected to a reduction reaction if the electrochromic layer is subjected to an oxidation reaction; and the counter layer is subjected to an oxidation reaction if the electrochromic layer is subjected to a reduction reaction.

8. The reflective display device of claim 5, wherein the electrolytic layer further comprises a reflective barrier configured to maintain a gap between the first substrate and the second substrate.

9. The reflective display device of claim 6, wherein the electrolytic layer further comprises a reflective barrier configured to maintain a gap between the first substrate and the second substrate.

10. The reflective display device of claim 1, wherein the display element further includes:

an auxiliary electrode;

a bank on the anode electrode and the auxiliary electrode and exposing an upper surface of the anode electrode and an upper surface of the auxiliary electrode; and a barrier on the auxiliary electrode and spaced apart from the bank at a predetermined distance, wherein the auxiliary electrode and the cathode electrode are electrically connected with each other through the spaced area between the barrier and the bank.

11. The reflective display device of claim 1, wherein:

a passivation layer and a planarization layer are between the display element and the first driving element; and the passivation layer is also between the reflective control element and the second driving element.

12. The reflective display device of claim 11, wherein the planarization layer is also between the reflective control element and the second driving element.

* * * * *